United States Patent [19]

Sugawara

[11] Patent Number: 5,521,548

[45] Date of Patent: May 28, 1996

[54] PHASE DETECTOR

[75] Inventor: Tsutomu Sugawara, Yokosuka, Japan

[73] Assignee: Kabushiki Kaisha Toshiba, Kawasaki, Japan

[21] Appl. No.: 493,938

[22] Filed: Jun. 23, 1995

[30] Foreign Application Priority Data

Jun. 23, 1994 [JP] Japan .................................. 6-141982

[51] Int. Cl.$^6$ .............................. H03D 3/02; H04L 27/22
[52] U.S. Cl. ..................... 329/306; 329/346; 327/350; 375/324; 375/329; 455/214; 455/337
[58] Field of Search ..................... 329/304–310, 329/345, 346; 375/279–284, 324–333; 327/350–354; 455/214, 303, 337

[56] References Cited

U.S. PATENT DOCUMENTS

| | | | |
|---|---|---|---|
| 3,255,417 | 6/1966 | Gottlieb | 327/350 |
| 3,740,750 | 6/1973 | Moulton | 327/350 X |
| 3,916,316 | 10/1975 | Hearn et al. | 327/350 X |
| 4,694,195 | 9/1987 | Stueck | 327/350 X |
| 4,745,309 | 5/1988 | Waller, Jr. | 327/350 X |

FOREIGN PATENT DOCUMENTS

| | | |
|---|---|---|
| 0332469 | 9/1989 | European Pat. Off. . |
| 58-196629 | 11/1983 | Japan . |
| 2284547 | 11/1990 | Japan . |

OTHER PUBLICATIONS

Patent Abstracts of Japan, vol. 017, No. 257 (E–1368), May 20, 1993, & JP–A–05 00299 (Toshiba Corp.), Jan. 8, 1993.
Patent Abstracts of Japan, vol. 013, No. 534 (E–852), Nov. 29, 1989 & JP–A–01 220341 (Toshiba Corp.) Sep. 4, 1989.

*Primary Examiner*—David Mis
*Attorney, Agent, or Firm*—Cushman Darby & Cushman

[57] ABSTRACT

In a phase detector, an input signal (Si) is multiplied in a multiplier by two reference signals intersecting at right angles with each other. Signals obtained by multiplication are passed through filters and subjected to quadrature demodulation. An I signal and a Q signal obtained by quadrature demodulation are input to non-linear compression circuits and compressed by logarithmic conversion. Based on the compressed I and Q signals, a phase detection circuit detects the phase of the input signal (Si).

18 Claims, 10 Drawing Sheets

PHASE DETECTOR

BACKGROUND OF THE INVENTION

1. Field of the Invention

The present invention relates generally to a phase detector for detecting the phase of an input signal, and more particularly to a phase detector used in a demodulator of a receiving apparatus such as a radio receiver, a TV receiver, a portable telephone or a cordless telephone.

2. Description of the Related Art

A direct conversion (DC) system is known as one of detection and demodulation systems for use in a receiving apparatus for receiving a signal having phase information. In the direct conversion (DC) system, a received signal is subjected to quadrature demodulation by using two reference signals having frequencies which are equal to a carrier frequency and different from each other by 90°. Thus, the received signal is directly converted to a base-band range signal. Unlike a heterodyne system, there is no need to use an intermediate frequency stage, and the receiving apparatus can be reduced in size and cost.

On the other hand, the direct conversion system needs to perform automatic gain control (AGC) to keep the level of a received signal constant, in the case where the dynamic range of the received signal is wide, e.g. 90 dB or more, as in an environment where a receiving field strength varies greatly, e.g. an environment of mobile communication. However, AGC, which is a feedback loop, cannot follow a rapid variation of the intensity in received electric field.

Unlike the heterodyne system, in the direct conversion system, AGC cannot be performed at the intermediate frequency stage and some means needs to be provided from an aspect of the system. Specifically, in the heterodyne system, a limiter amplifier is provided in the intermediate frequency stage to limit amplitude and necessary phase information alone is taken out. Accordingly, even if the dynamic range of the received signal is wide, demodulation can be performed exactly. Furthermore, in the heterodyne system, if a received signal is a QPSK modulated signal, the received signal is passed through a proper wave shaping filter for reducing inter-code interference and then subjected to amplitude limitation. Thereby, good demodulation characteristics can be achieved. In the direct conversion system, however, no stage is provided for converting a received signal to a signal with a constant frequency, e.g. an intermediate frequency signal. Consequently, it is not possible to keep the level of the signal constant by means of a limiter amplifier.

In order to cope with this problem, it has been proposed (in Jap. Pat. Appln. KOKAI No. 58-196629) that in the direct conversion system, a received signal is converted directly to a base band signal by quadrature demodulation and the resultant signal is further frequency-converted to an intermediate frequency signal, and then the intermediate frequency signal is subjected to amplitude limitation. This system, however, requires a frequency reconverting circuit and a limiter circuit, resulting in a very complex structure. Consequently, the advantages of the direct conversion system, i.e. small and inexpensive structures are lost.

As has been described above, in the conventional receiving apparatus of the direct conversion system, in order to process a received signal with a wide dynamic range, a signal is directly converted to a base band signal and the converted signal is subjected to frequency reconversion and then to amplitude limitation. With this prior art, the structure is very complex and an inexpensive receiving apparatus having a small size and high performance is difficult to obtain.

SUMMARY OF THE INVENTION

The object of the present invention is to provide a phase detector having a simple structure capable of exactly detecting the phase of an input signal with a wide dynamic range.

The present invention provides a phase detection apparatus comprising at least one non-linear compression circuit for non-linearly compressing first and second signals being in quadrature with each other, and a phase detection circuit for detecting the phase of an input signal from two signals compressed by the non-linear compression circuit.

In the case of a demodulation circuit used in a receiving apparatus, the first and second signals being in quadrature with each other are obtained by a quadrature demodulator for subjecting an input signal to quadrature demodulation with use of first and second reference signals having phases differing from each other by 90°.

In the phase detector of the present invention, the first and second signals being in quadrature with each other are non-linearly compressed by means of logarithmic conversion and then the phase of the input signal is detected. Thus, the phase of an input signal with a very wide dynamic range, which is obtained in, e.g. a direct conversion system, can be detected with a simple, small and inexpensive structure and with quick follow-up to the input signal. In the direct conversion system, the first and second signals are obtained by directly converting the input signal by means of quadrature demodulation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Embodiments of the present invention will now be described with reference to the accompanying drawings.

Figure 1:
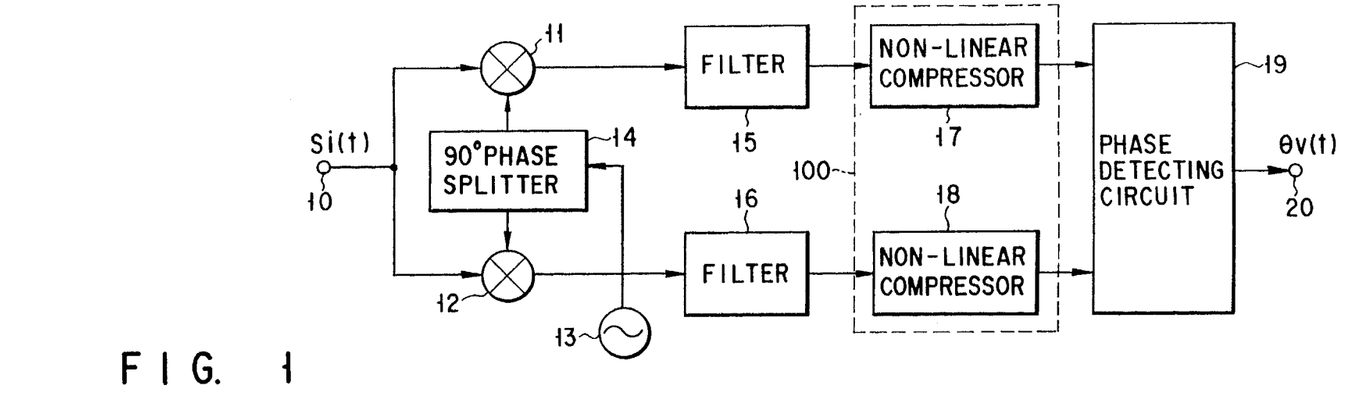
FIG. 1 is a block diagram showing an embodiment of a phase detector according to the present invention.

FIG. 1 is a block diagram showing a basic embodiment of the phase detector according to the present invention. In FIG. 1, an input signal Si(t) including phase information, e.g. a QPSK modulated signal, is delivered to an input terminal 10. The input signal Si(t) is input to two multipliers 11 and 12, where the input signal Si(t) is multiplied with first and second reference signals which are obtained by passing an output signal of a reference signal generator 13 through a 90° phase splitter 14 and are in quadrature with each other. Thus, the input signal Si(t) is subjected to quadrature demodulation (direct conversion). As a result, two base band signals (I signal and Q signal) are output from the multipliers 11 and 12. The reference signal generator 13 is constituted by an oscillator, and an output signal therefrom is controlled to have a frequency equal to that of a carrier frequency of the input signal Si(t).

The I signal and Q signal output from the multipliers 11 and 12 are input to filters 15 and 16. Each of the filters 15 and 16 comprises a base-band channel selection filter (a low-pass filter) for selecting a signal of a desired channel, and a wave-shaping filter for compensating an inter-code interference over a transmission line. Output signals I(t) and Q(t) from the filters 15 and 16 are given by $$I(t) = A\cos\{\theta s(t)\} \quad (1)$$

$$Q(t) = A\sin\{\theta s(t)\} \quad (2)$$

where A is the amplitude of input signal Si(t), and θs is the phase of input signal Si(t).

The output signals from the filters 15 and 16 are non-linearly compressed by a non-linear compression unit 100. Specifically, the output signals are supplied to non-linear compressors 17 and 18 and non-linearly compressed. Then, the compressed signals are input to a phase detection circuit 19. The non-linear compressors 17 and 18 compress the dynamic ranges of the output signals from the filters 15 and 16. Specifically, the non-linear compressors 17 and 18 are constituted by logarithmic converters, as will be described below. The phase detection circuit 19 finds a phase θs of the input signal Si(t) from the output signals of the non-linear compression circuits 17 and 18 by arithmetic operations, and, if necessary, an amplitude A of the input signal Si(t). The specific structure of the phase detection circuit 19 will be described in the following description of the embodiments.

Figure 2:
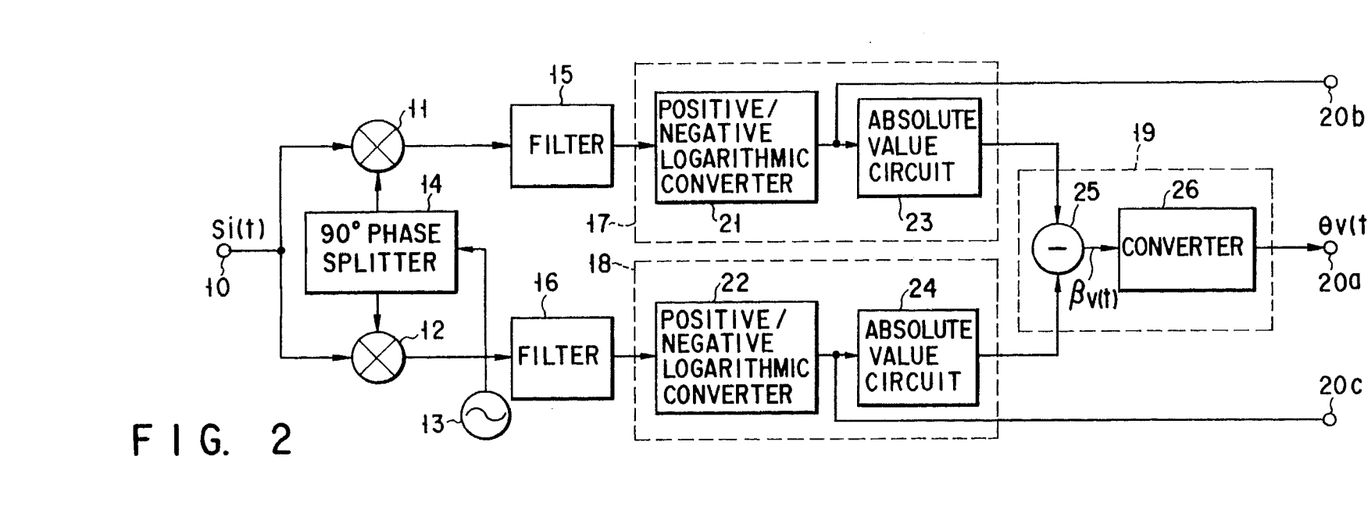
FIG. 2 is a block diagram showing a more specific structure of the phase detector shown in FIG. 1.

FIG. 2 shows a more specific structure of the apparatus shown in FIG. 1. In FIG. 2, a non-linear compression circuit 17 comprises a positive/negative logarithmic converter 21 and an absolute value circuit 10 23 which are cascade-connected. Similarly, a non-linear compression circuit 18 comprises a positive/negative logarithmic converter 22 and an absolute value circuit 24 which are cascade-connected. The positive/negative logarithmic converters 21 and 22 perform logarithmic conversions for both positive and negative waves. The absolute value circuits 23 and 24 detect absolute values of output signals from the positive/negative logarithmic converters 21 and 22. Output signals I1(t) and Q1(t) of the absolute value circuits 23 and 24 are given by $$\frac{Q(t)}{I(t)} = \tan(\theta s(t)) \quad (3)$$

$$\theta s(t) = \tan^{-1}\frac{Q(t)}{I(t)} \quad (4)$$

$$I1(t) = \log\{abs(I(t))\} \quad (5)$$

$$Q1(t) = \log\{abs(Q(t))\} \quad (6)$$

where abs[x] is the absolute value of x.

The phase detection circuit 19 is constituted by a subtraction circuit 25 and a converter 26 for performing non-linear conversion. The subtraction circuit 25 finds a difference, i.e. β(t) defined in the following equation (7), between the output signals I1(t) and Q1(t) of the absolute value circuits 23 and 24 which are non-linearly compressed signals.

$$\begin{aligned}\beta(t) &= Q1(t) - I1(t) \\ &= \log[abs\{Q(t)/I(t)\}]\end{aligned} \quad (7)$$

As is understood from equation (7), β(t) depends on the ratio between the I signal and Q signal. Thus, β(t) includes phase information. Specifically, the operation of finding a difference between the logarithmically converted two signals corresponds to the operation of finding the ratio between two signals before logarithmic conversion. Thus, if the two signals before the logarithmic conversion are signals being in quadrature with each other, i.e. I signal and Q signal, the difference therebetween contains phase information.

Figure 3:
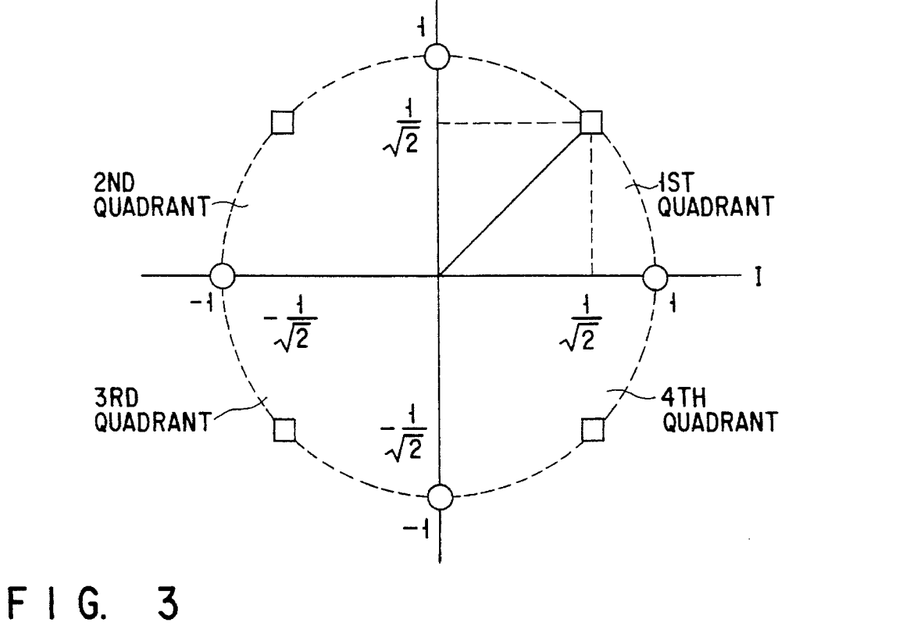
FIG. 3 shows an IQ plane.

In addition, based on the codes of I signal and Q signal, it is possible to determine one of the four quadrants, in which the input signal Si(t) is located at every π/2. Suppose that the signs of both I signal and Q signal are positive, i.e. the input signal Si(t) is located in the first quadrant (0 to π/2) of IQ plane, as shown in FIG. 3. The phase θs(t) of the input signal Si(t) can be found by performing the non-linear conversion expressed by the following equation (8) by means of the converter 26.

$$\theta s(t) = \arctan [\exp \{\beta(t)\}] \quad (8)$$

Specifically, since it is found from equation (7) that exp $\{\beta(t)\}$ corresponds to $Q1(t)/I1(t)$, the phase $\theta s(t)$ can be obtained by finding the arc tangent of $Q1(t)/I1(t)$. In this case, the signs +, + representing the first quadrant are output from the positive/negative logarithmic converters 21 and 22 to terminals 20b and 20c.

On the other hand, the amplitude A of the input signal Si(t) can be obtained through the following operation:

$$2\log(A) = \log [\exp\{2I1(t)\} + \exp \{2Q1(t)\}] \quad (9)$$

The signs of the second quadrant are −,+; those of the third quadrant are −, −; and those of the fourth quadrant are +,−.

Figure 4:
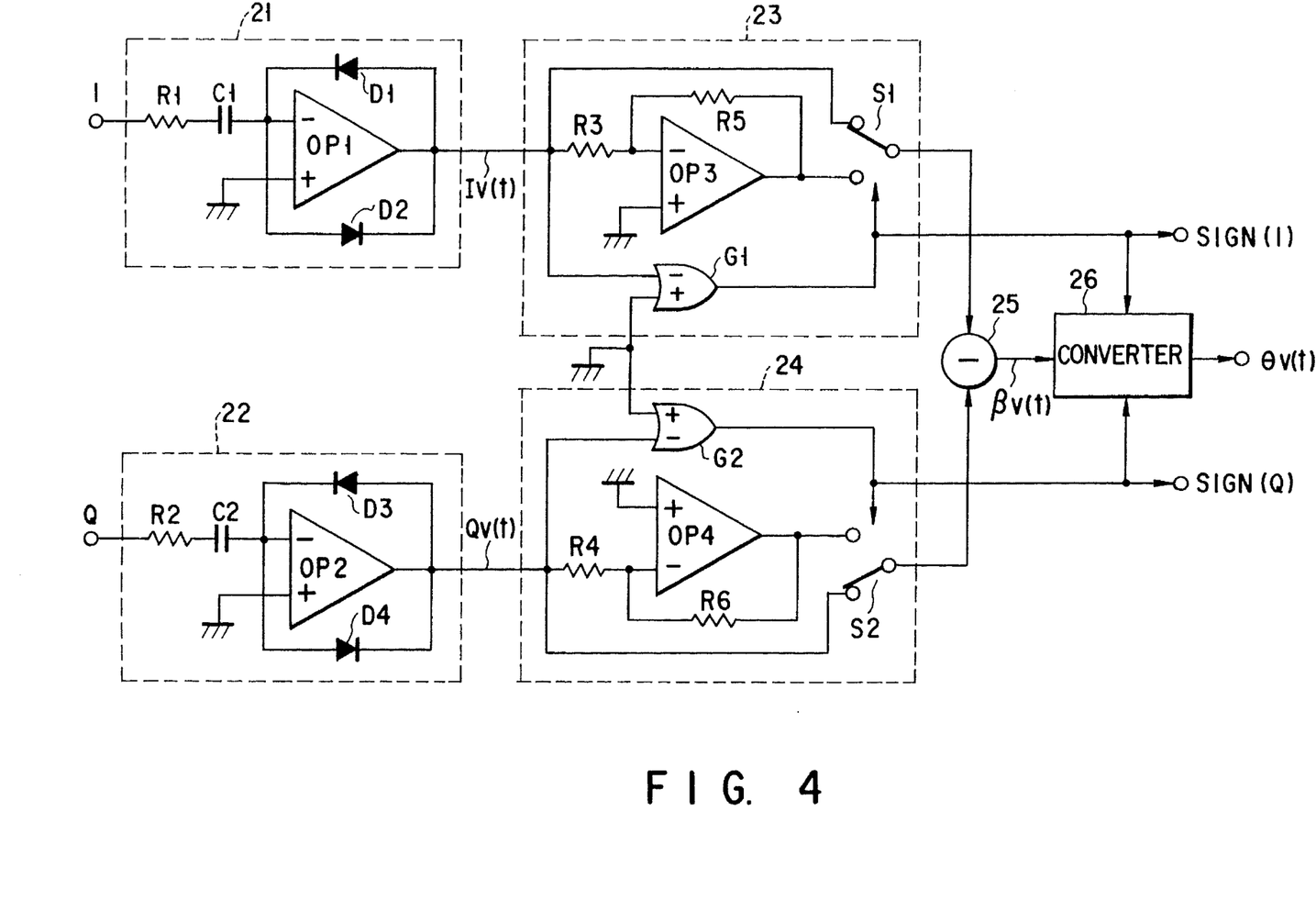
FIG. 4 is a circuit diagram showing in detail a main part of the apparatus show in FIG. 2.

FIG. 4 shows specific examples of the positive/negative logarithmic circuits 21 and 22 and absolute value circuits 23 and 24 shown in FIG. 2. The positive/negative logarithmic converter 21 for the I signal comprises a series circuit of a resistor R1 and a capacitor C1 provided on the input side, an operational amplifier OP1, and diodes D1 and D2 connected in parallel in opposite directions between an inverted input terminal and an output terminal of the operational amplifier OP1. The exponential characteristics between a diode forward current and a voltage drop are utilized, and the diodes D1 and D2 are inserted in a negative feedback circuit. Thereby, the logarithmic conversion or an inverse conversion of an exponential conversion is performed for both positive and negative components of the signal I1(t). Similarly, the positive/negative logarithmic converter 22 for the Q signal comprises a series circuit of a resistor R2 and a capacitor C2 10 provided on the input side, an operational amplifier OP2, and diodes D3 and D4 connected in parallel in opposite directions between an inverted input terminal and an output terminal of the operational amplifier OP2. The positive/negative logarithmic converter 22, like the positive/negative logarithmic converter 21, performs logarithmic conversion for both positive and negative components of the signal Q1(t).

The diodes D1 to D4 may be replaced with bipolar transistors on an IC, the collectors and bases of which are connected. In this case, the logarithmic compression is performed by making use of collector current vs. base/emitter voltage characteristics (Ic-Vbe characteristics) or emitter current vs. base/emitter voltage characteristics (Ie-Vbe characteristics). Specifically, the basic characteristics of the bipolar transistors are expressed by $$Ic = Is \{\exp (Vbe/Vt) - 1\} \quad (10)$$

where Vt is the thermal voltage (=kT/q) and Is is the saturation current.

Thus, $$Vbe = Vt \log \{(Ic/Is) + 1\} \quad (11)$$

There is a logarithmic relationship between Ic and Vbe. Accordingly, the output signals of the positive/negative logarithmic converters 21 and 22 in FIG. 4 are expressed by $$Iv(t) = \text{sign} (I)Vt \times \log [abs \{I(t)/Is \}] \quad (12)$$

$$Qv(t) = \text{sign} (Q)Vt \times \log [abs \{Q(t)/Is \}] \quad (13)$$

where sign (I) and sign (Q) represent the signs (polarities) of the signals Iv(t) and Qv(t).

The absolute value circuit 23 comprises an inverting amplifier including an operational amplifier OP3 and resistors R3 and R5, a switch S1 for selecting one of an input signal and an output signal of the inverting amplifier, and a gate circuit G1 for controlling the switch S1 in accordance with the polarity of the input signal of the inverting amplifier. The input signal of the inverting amplifier is selected by the switch S1 when the input signal of the inverting amplifier is positive, and the output signal of the inverting amplifier is selected when the input signal of the inverting amplifier is negative. Thereby, the absolute value of the output signal of the positive/negative logarithmic converter 21 is found. Similarly, the absolute value circuit 24 comprises an inverting amplifier including an operational amplifier OP4 and resistors R4 and R6, a switch S2 for selecting one of an input signal and an output signal of the inverting amplifier, and a gate circuit G2 for controlling the switch S2 in accordance with the polarity of the input signal of the inverting amplifier. The absolute value circuit 24 finds the absolute value of the output signal of the positive/negative logarithmic converter 22.

The signals non-linearly compressed by the positive/negative logarithmic conversion circuits 21 and 22 and absolute value circuits 23 and 24 are input to the subtraction circuit 25, and a difference $\beta v(t)$ therebetween is found by the following equation:

$$\begin{aligned} \beta v(t) &= |Qv(t)| - |Iv(t)| \\ &= Vt \times \log [abs\{Q(t)/I(t)\}] \end{aligned} \quad (14)$$

The difference signal $\beta v(t)$ output from the subtraction circuit 25 is input to the converter 26. The converter 26 finds the phase $\theta v(t)$, for example, by digitizing the difference signal $\beta v(t)$ from the subtraction circuit 25 by means of an A/D converter and subjecting the digitized signal to non-linear conversion expressed by the following equation (15). The phase $\theta v(t)$ corresponds to the phase $\theta s$ of the input signal Si(t).

$$\theta v(t) = \arctan [\exp \{\beta v(t)/Vt\}] \quad (15)$$

Figure 5:
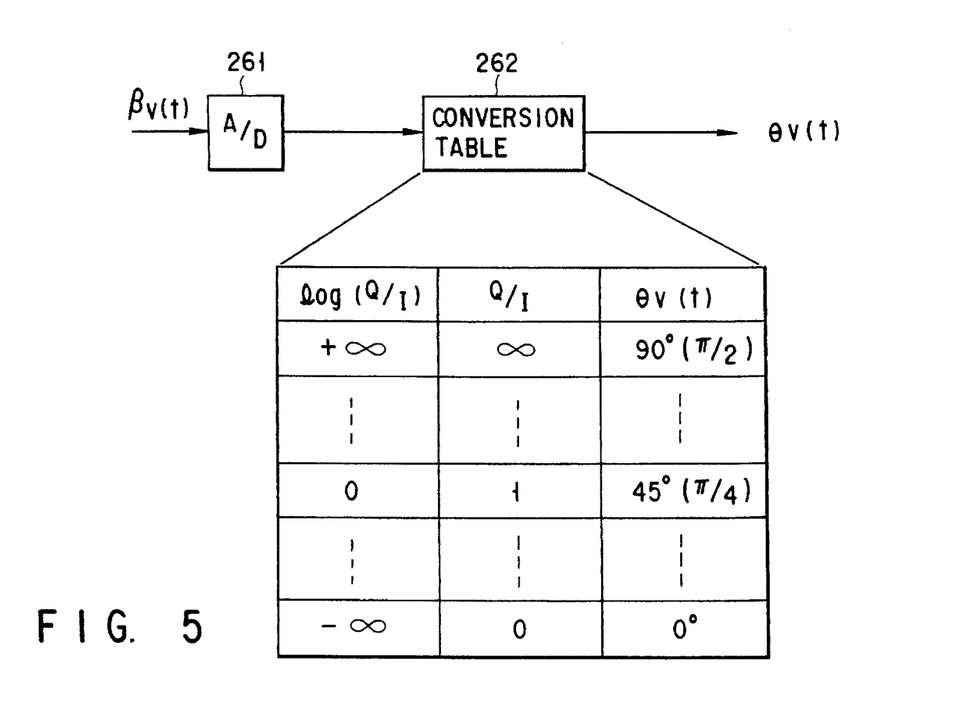
FIG. 5 is a block diagram showing a converter circuit in FIG. 4.

The converter 26 is obtained, for example, by a table using an A/D converter 261 and a ROM 262, as shown in FIG. 5. Specifically, the ROM 262 is designed to store various values of arctan [exp $\{\beta v(t)/Vt\}$] in equation (15) as digital values. The stored values are read out by using the signal $\beta v(t)$ output from the A/D converter 261 as address data. In this case, the signal $\beta v(t)$ is compressed by the logarithmic conversion. Thus, even in the case where the resolution of, e.g. about 1° is required as that of the phase $\theta v(t)$, an A/D converter having a resolution of about 7 bits may be used as the A/D converter for digitizing the signal $\beta v(t)$.

On the other hand, the output signals of the gate circuits G1 and G2 are taken as sign data, sign (I) and sign (Q), representing the polarities (signs) of the output signals of the positive/negative logarithmic converters 21 and 22. The sign data sign (I) and sign (Q) are led to the outside, when necessary, and are used in the converter 26 to exactly find the phase $\theta s$ by detecting the quadrature of the input signal Si(t).

An example of a more specific structure of the converter circuit 26 shown in FIGS. 2 or 4 will now be described with reference to FIG. 6. In the structure shown in FIG. 6, a collector current of complementary transistors having emitters commonly connected has a relationship of tanh (hyperbolic tangent) to a common emitter current, and the feature that tanh (X) is very close to arctan (exp(X)) is made use of.

Figure 6:
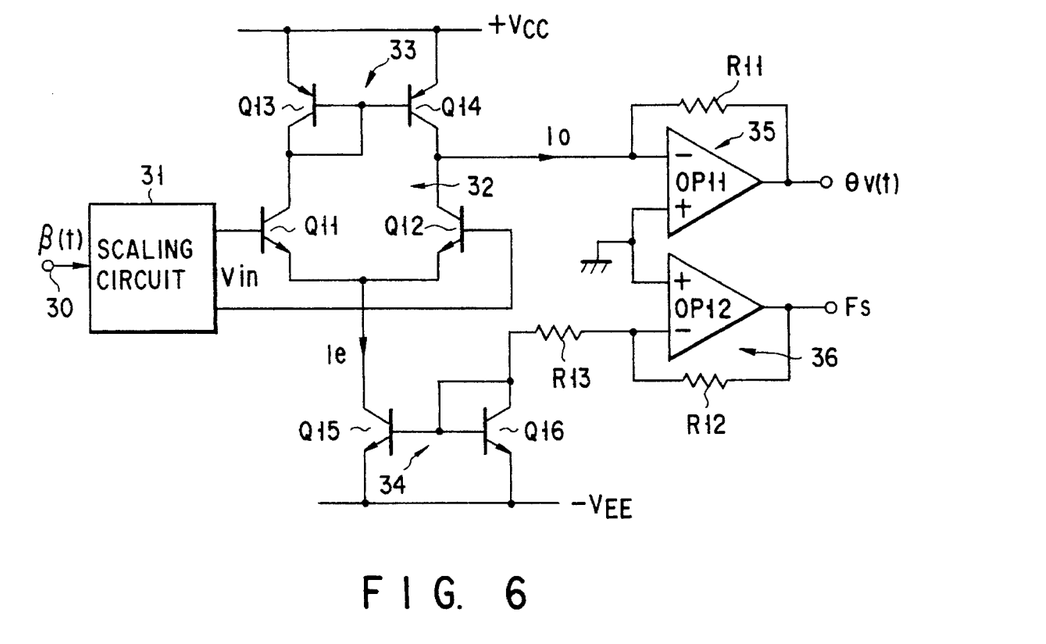
FIG. 6 is a circuit diagram showing in detail another main part in FIG. 2.

In FIG. 6, a difference signal $\beta v(t)$ output from the subtraction circuit 25 shown in FIGS. 2 or 4 is delivered to an input terminal 30. The difference signal $\beta v(t)$ is input to a scaling circuit 31 and multiplied by a proper coefficient K, as expressed by the following equation (16), to become a signal Vin:

$$V_{in} = K \cdot \beta v(t) \quad (16)$$

where $K=4/\pi$ or $K=0.96 \cdot \pi/4$.

The Vin is output from the scaling circuit 31 as a differential signal. The differential signal is applied to the bases of complementary transistors Q11 and Q12 of a differential amplifier 32. The collectors of the complementary transistors Q11 and Q12 are connected to a current mirror circuit 33 constituted by transistors Q13 and Q14. A common emitter of the transistors Q11 and Q12 is connected to a collector of a current source transistor Q15 biased by a transistor Q16 to flow a constant current. The transistors Q15 and Q16 constitute a current-mirror bias circuit. In this case, the following equation is obtained if a collector current of the current source transistor Q15, i.e. a common emitter current of the complementary transistors Q11 and Q12, is Ie and an output current of the current mirror circuit 33, which is a load to the complementary transistors Q11 and Q12 is Io:

$$Io = Ie \cdot \tanh(V_{in}/2V_t) \quad (17)$$

Specifically, the output current Io of the current circuit 33 is a value obtained by multiplying the hyperbolic tangent value of $V_{in}/2V_t$ by the common emitter current Ie. The output current Io of the current mirror circuit 33 is converted to a voltage signal by a current-to-voltage converter 35 comprising an operational amplifier OP11 and a resistor R11. Thus, a phase detection signal $\theta v(t)$ expressed by the following equation is obtained:

$$\theta v(t) = K \cdot \{(Io/Ie) + 1\} \quad (18)$$

where K is a coefficient provided by the scaling circuit 31.

Figure 7:
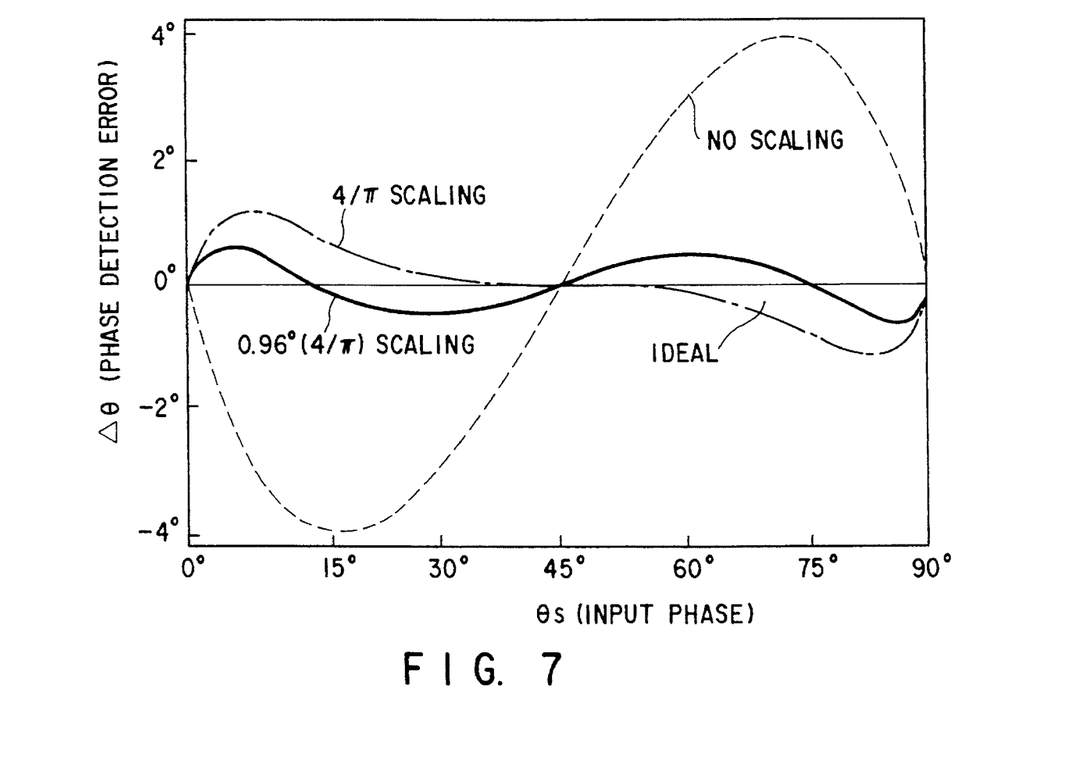
FIG. 7 is a graph showing characteristics of phase detection errors in the case where scaling was performed by a scaling circuit shown in FIG. 4 and in the case where the scaling was not performed.

The value of the phase detection signal $\theta v(t)$ corresponds to the phase $\theta s$ of the input signal $Si(t)$. In particular, by properly choosing K, a value very close to $\theta s$ is obtained. FIG. 7 shows the relationships between the input phase, i.e. the phase $\theta s$ of the input signal $Si(t)$, and the phase detection error, i.e. a phase error $\Delta\theta(=\theta v-\theta s)$ indicated by the phase detection signal $\theta v(t)$, both in the case where the scaling was not performed by the scaling circuit and where it was performed. When the scaling was not performed, a relatively large phase detection error of about 4° occurred. When the scaling was performed at $K=\pi/4$, the phase detection error was reduced to about 1°. When the scaling was performed at $K=0.96 \cdot \pi/4$, the phase detection error was reduced to about 0.5°.

Furthermore, according to this structure, thermal voltage Vt is automatically removed from the phase detection signal $\theta v(t)$, and the phase detection signal $\theta v(t)$ directly represents the phase $\theta s$ of the input signal $Si(t)$. Thus, there is no influence of temperature variation.

The thus obtained phase detection signal $\theta v(t)$ is digitized by an A/D converter on an as-needed basis and then properly processed. In this case, since phase information was already obtained at the stage of input to the A/D converter, phase conversion means for the digital signal was unneeded.

In FIG. 6, a bias current of the bias circuit 34 is converted to a voltage signal by a current-voltage converter 36 comprising an operational amplifier OP12 and resistors R12 and R13. Thus, a signal Fs representing a full-scale value is derived.

Other embodiments of the present invention will now be described.

Figure 8:
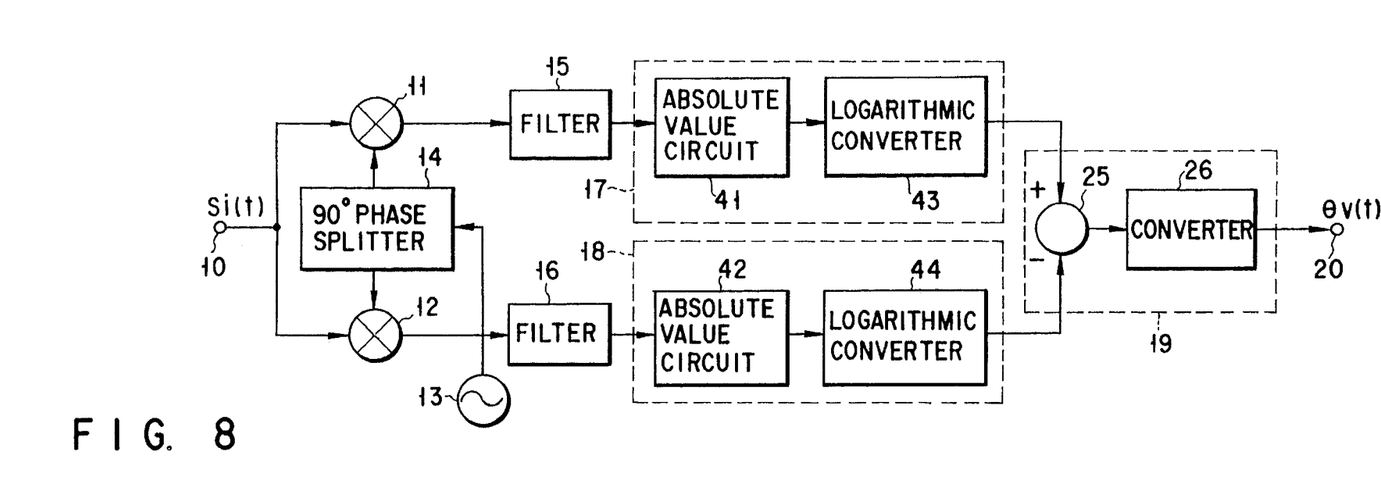
FIG. 8 is a block diagram showing another embodiment of the phase detector according to the present invention.

FIG. 8 shows an embodiment wherein the positions of the logarithmic converters 21 and 22 and those of the absolute value circuits 23 and 24 in the non-linear compressors 17 and 18 shown in FIG. 2 are interchanged. Specifically, output signals from the filters 15 and 16 are converted to absolute values by the absolute value circuits 41 and 42 and then input to the logarithmic converters 43 and 44. In the preceding embodiment, since the inputs to the absolute value circuits 23 and 24 are compressed by the positive/negative logarithmic converters 21 and 22, the absolute value circuits 23 and 24 are easily realized. On the other hand, in the present embodiment, the logarithmic converters 43 and 44 of the single polarity type, i.e. logarithmic converters for logarithmically converting positive signals, may be used. Thus, the logarithmic compressors can be easily realized.

Figure 9:
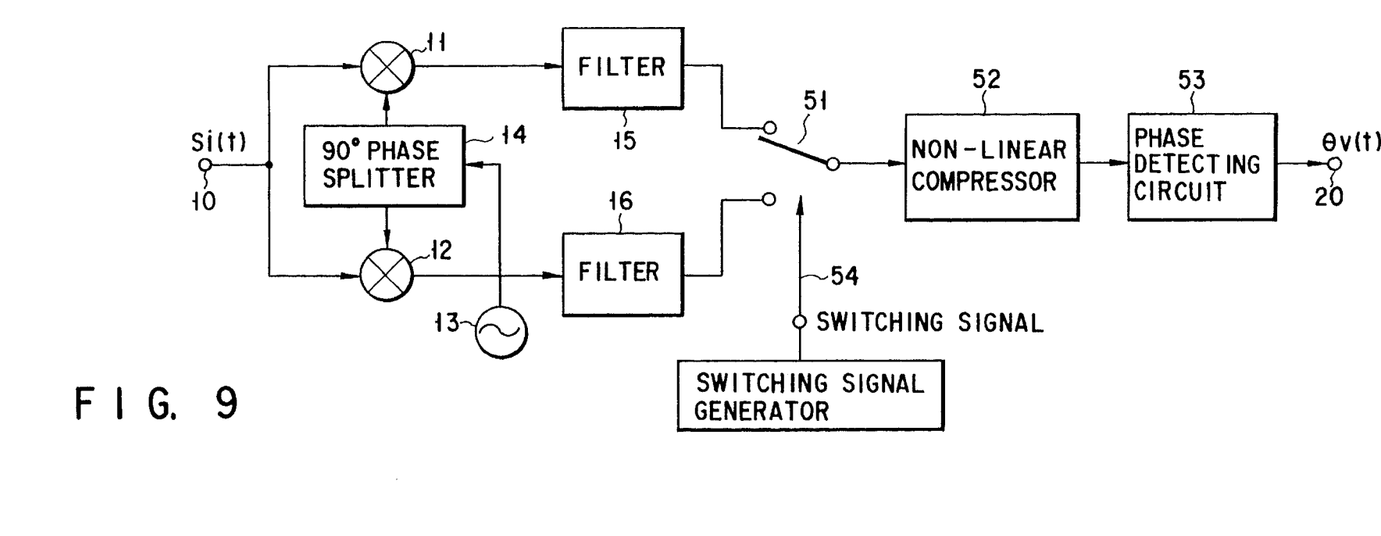
FIG. 9 is a block diagram showing still another embodiment of the phase detector according to the invention, wherein a non-linear compression circuit is switched in use

FIG. 9 shows a phase detector wherein output signals of the filters 15 and 16 are switched by a switch 51 and input to a single non-linear compressor 52. An output signal of the non-linear compressor 52 is delivered to a phase detection circuit 53 and, like the preceding embodiments, the phase of the input signal $Si(t)$ is detected. The structures of the non-linear compressor 52 and phase detection circuit 53 may be the same as the counterparts in the preceding embodiments. A switch signal 54 is produced to control the switch 51, and the switching period is properly chosen.

According to the present embodiment, two signals output from the filters 15 and 16 are compressed by the common non-linear compressor 52. Even if the characteristics of the non-linear compressor 52 vary, the two signals are equally influenced. Thus, the variance in characteristics does not adversely affect the phase detection signal. In particular, in the case of the structure wherein a logarithmic converter is used as non-linear compressor 52 and the phase is detected after finding a difference between two signals logarithmically compressed by the phase detector 53, the influence of variance in characteristics of the non-linear compressor 52 can be canceled at the stage of finding the difference between the two signals.

Figure 10:
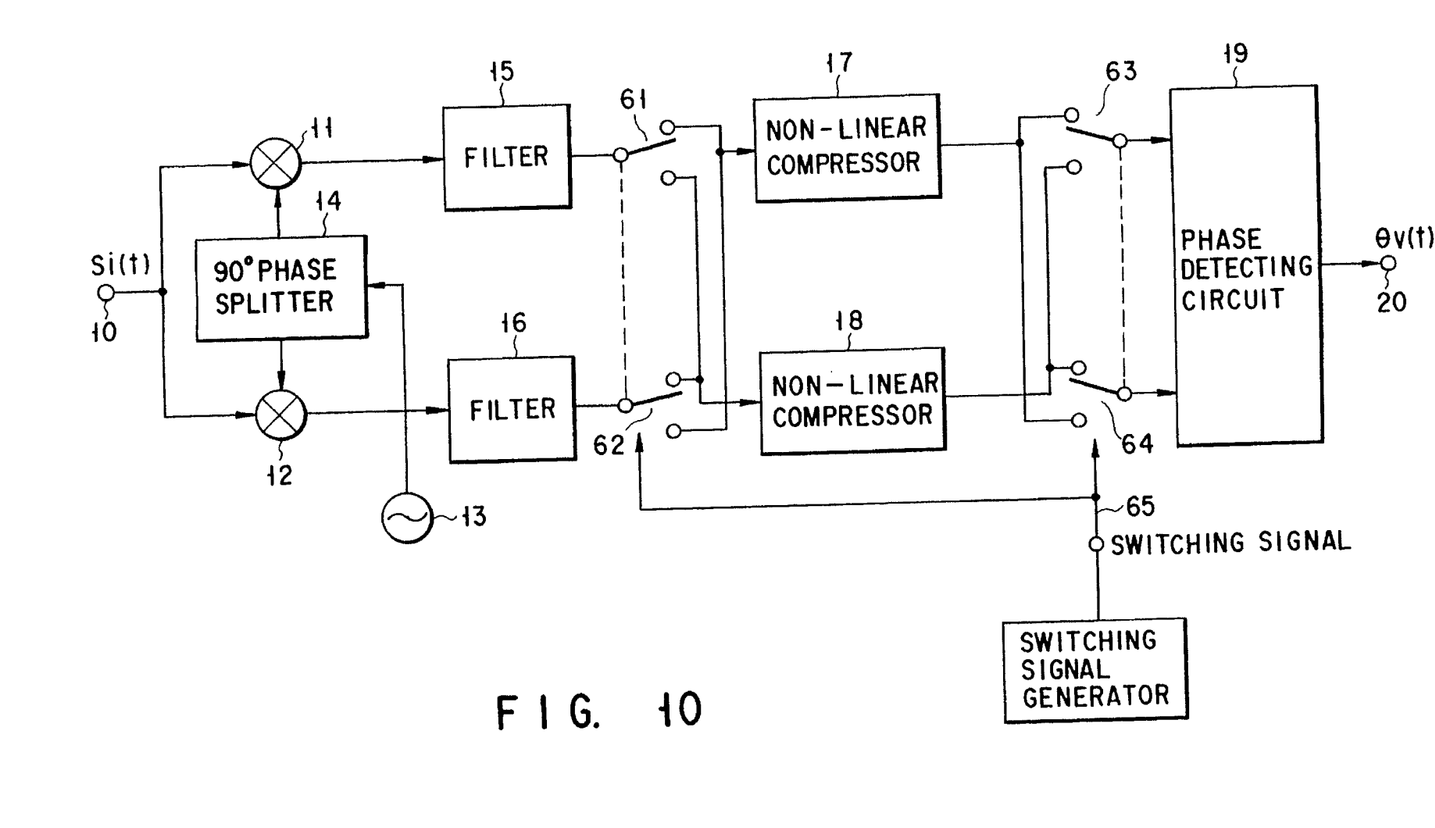
FIG. 10 is a block diagram showing still another embodiment of the phase detector of the invention, wherein two not-linear compression circuits are switched alternately.

FIG. 10 shows an embodiment of a phase detector wherein switches 61 and 62 and switches 63 and 64 are added to the structure shown in FIG. 1. The switches 61 and 62 are provided on the input side of the non-linear compressors 17 and 18, and the switches 63 and 64 are provided on the output side of the non-linear compressors 17 and 18. In a first time period, a switch signal 65 is supplied to deliver the output signal of the filter 15 to the phase detection circuit 19 via the non-linear compressor 17 and to deliver the output signal of the filter 16 to the phase detection circuit 19 via the non-linear compressor 18. In a second time period, the output signal of the filter 15 is delivered to the phase detection circuit 19 via the non-linear compressor 18, and the output signal of the filter 16 to the phase detection circuit 19 via the non-linear compressor 17. Specifically, the signal paths for delivering the output signals of the filters 15 and 16 to the phase detection circuit 19 via the non-linear compressors 17 and 18 and the switches 61-64 are alternately changed at a predetermined cycle determined by the switch signal 65.

According to the present embodiment, the influences of the two non-linear compressors 17 and 18 are averaged, thereby eliminating the influence of characteristic variations and errors of the non-linear compressors 17 and 18.

Figure 11:
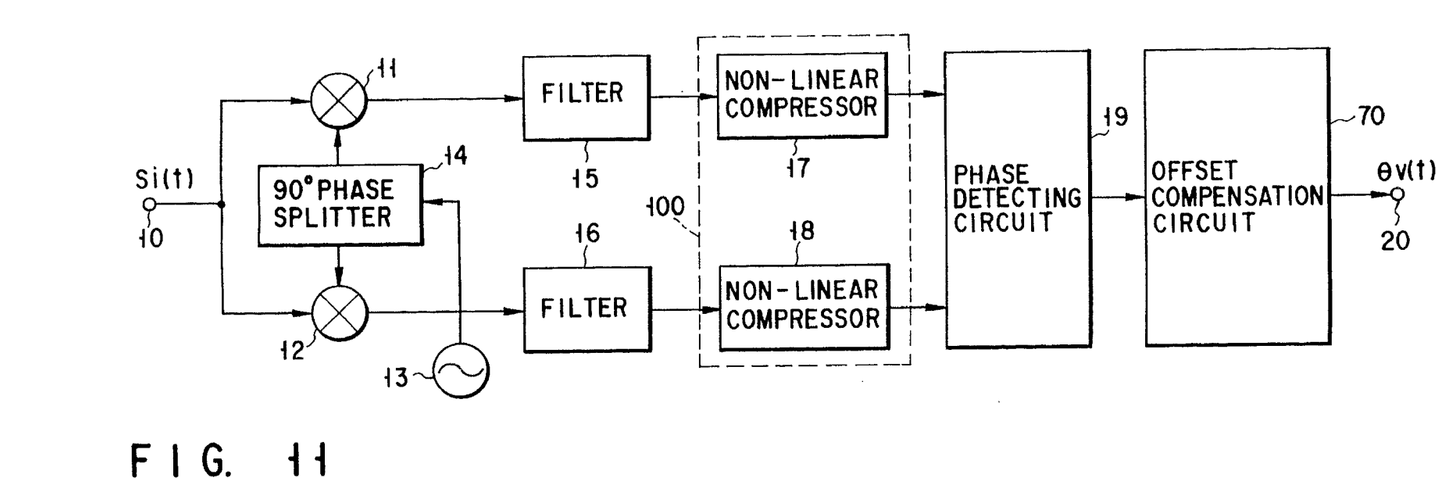
FIG. 11 is a block diagram showing still another embodiment of the phase detector of the invention, wherein an offset compensation circuit is provided.

FIG. 11 shows an embodiment of the phase detector according to the invention, wherein an offset compensation circuit 70 is provided at the rear stage of the phase detection circuit 19. In an analog circuit, an error will often occur due to a variance in circuit constant. In the present embodiment, a phase error due to such an error of the analog circuit can be compensated. A main factor of the phase detection error is an offset error due to a relative amplitude error between an I signal and Q signal. The offset compensation circuit 70 compensates the offset error.

Figure 12:
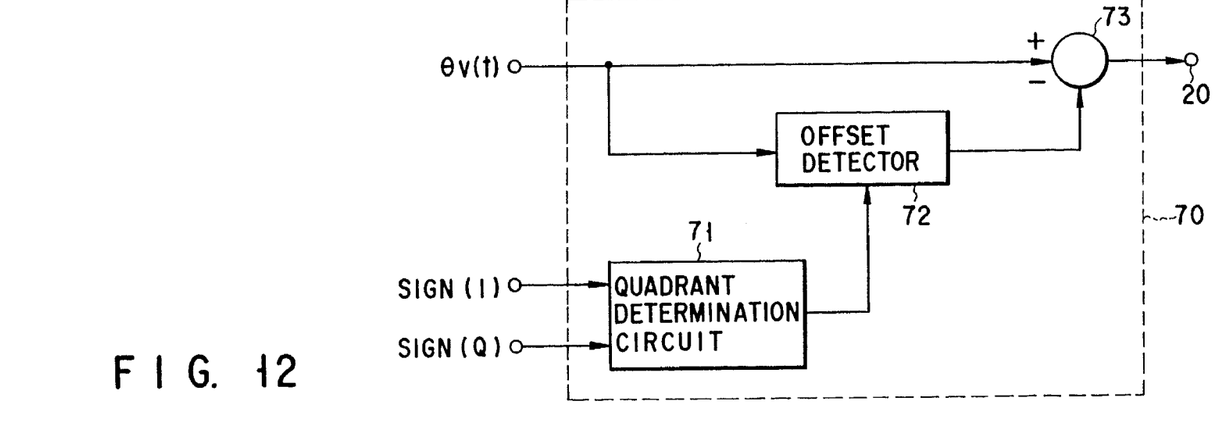
FIG.12 is a block diagram showing the offset compensation circuit shown in FIG. 11.

FIG. 12 shows a structure of the offset compensation circuit 70. The offset compensation circuit 70 comprises a quadrant determination circuit 71, an offset detection circuit 72 and an arithmetic operation circuit 73 for eliminating the offset error. The quadrant determination circuit 71 determines the quadrant of the input signal Si(t) from sign data sign (I) and sign (Q) (see FIG. 3) output from the phase detection circuit 19. The offset detection circuit 72 detects an offset included in the phase detection signal θv(t) output from the phase detection circuit 19. There are two methods of detecting the offset.

According to the first method, when an apparatus such as a receiving equipment, to which the phase detection apparatus of the present invention, is activated, already known I signal and Q signal corresponding to each quadrant are input as reference signals to the non-linear compressors 15 and 16. In this state, an offset included in the phase detection signal θv(t) from the phase detection circuit 19 is detected for each quadrant determined by the quadrant determination circuit 71. Signals with equal amplitudes corresponding to, e.g. 45° phase are suitable as I signal and Q signal used as reference signals. In this case, if there is an offset in the outputs of the non-linear compressors 15 and 16, an amplitude error corresponding to the offset occurs in the I signal and Q signal with equal amplitudes. Thus, the offset can be detected from the amplitude error.

According to the second method, in the state in which the input signal (received signal) Si(t) has been actually input, the offset detection circuit 72 calculates an average value of the phase detection signal θv(t) output from the phase detection circuit 19 for each quadrant determined by the quadrant determination circuit 71. Based on the average value, an actual offset is estimated and detected. The offset can also be estimated by calculating an average value of the output signal of, e.g. a logarithmic converter, instead of calculating the average value of the phase detection signal θv(t). In this case, it is necessary that the statistical nature of the input signal (received signal) Si(t) be already known. Since the average value of the phase which the received signal with, e.g. a frequency offset can take is uniform, it is possible to make use of this average value.

Figure 13:
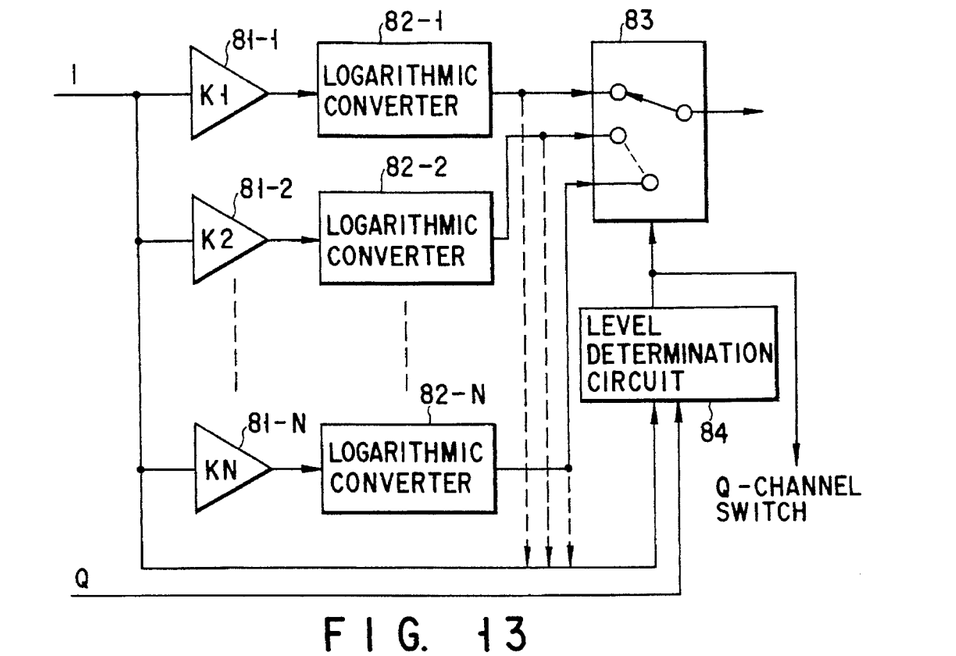
FIG. 13 is a block diagram showing a main part of a still another embodiment of the phase detector according to the invention, wherein a coefficient is switched according to an input signal level.

FIG. 13 shows an embodiment of the phase detector of the invention. In this embodiment, a plurality (N) of series circuits of coefficient devices 81-1 to 81-N and logarithmic converters 82-1 to 82-N are arranged in parallel for the I signal and Q signal obtained by the quadrature modulation circuit comprising the multipliers 11 and 12, reference signal generator 13 and 90° phase splitter 14. The output of one of logarithmic converters, 81-i (i=1, 2, . . . , N) is selected by a switch 83 on the basis of a level determination circuit 84 for determining the level (amplitude) of, e.g. input signal Si(t). The level determination circuit 84 may determine the level of another signal, e.g. the level of the output of one of logarithmic converters 82-1, 82-2, . . . , 82-N, if the signal varies in accordance with the level variation of the input signal Si(t).

Figure 14:
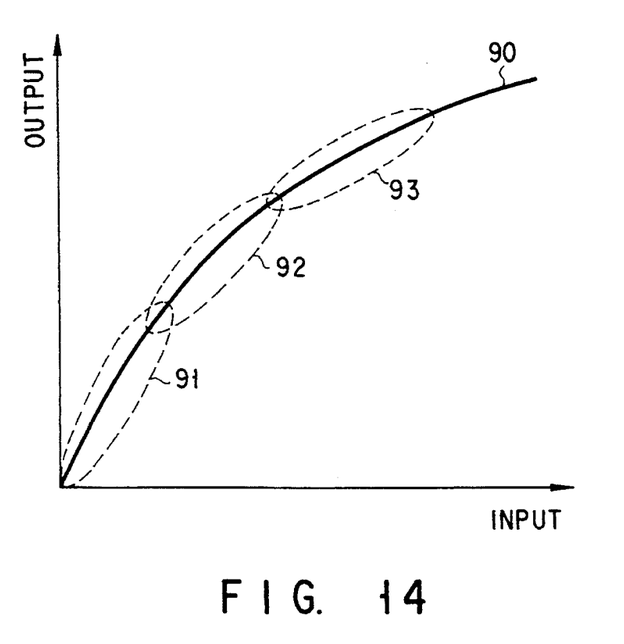
FIG. 14 is a graph showing input/output characteristics for explaining the operation of the embodiment shown in FIG. 13.

In general, it is difficult to logarithmically convert an input signal having a very wide dynamic range, e.g. 90 dB or above, by means of a single logarithmic converter. In the present embodiment, as shown in FIG. 14, required logarithmic conversion characteristics 90 are divided into a plurality of regions 91, 92, 93 . . . , and the input signal is logarithmically converted by different logarithmic converters 82-1 to 82-N for the respective regions 91, 92, 93 . . . . In this case, the logarithmic converters 82-1 to 82-N of the same structure can be used, if the coefficients (gains) K1 to KN of the coefficient devices 81-1 to 81-N are made different and the amplitude variation ranges of inputs to the logarithmic converters 82-1 to 82-N are made different. It is effective to partially overlap the regions 91, 92, 93, . . . associated with the logarithmic converter circuits 82-1 to 82-N.

Figure 15:
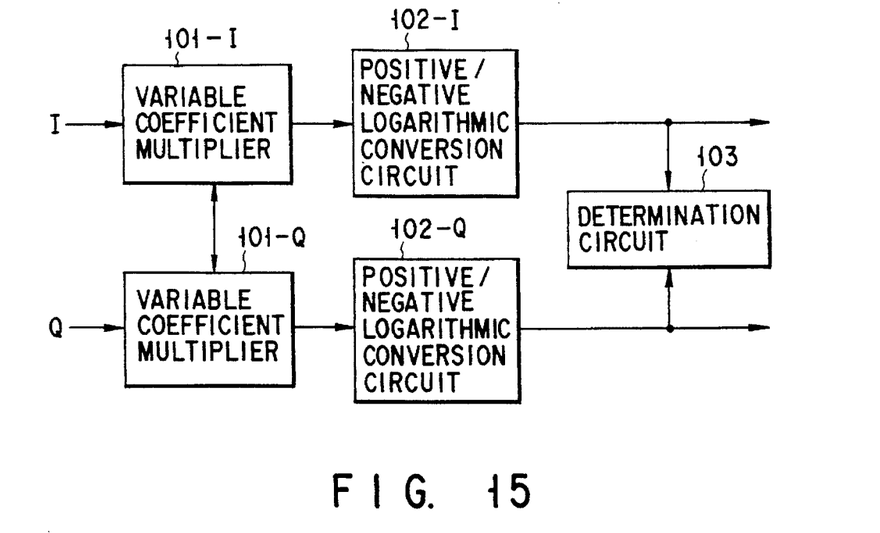
FIG. 15 is a block diagram showing a main part of a phase detector having a coefficient multiplier which is variable according to an input signal level, according to still another embodiment of the invention.

FIG. 15 shows a phase detector in which an input signal of a very wide dynamic range can be used for phase detection, like the embodiment shown in FIG. 13. According to this embodiment, an I signal and a Q signal are input to input terminals of variable coefficient multipliers 101-I and 101-Q, and output terminals thereof are connected to input terminals of positive/negative logarithmic conversion circuits 102-I and 102-Q. The output terminals of the logarithmic conversion circuits 102-I and 102-Q are connected to an error detection circuit 103. The error detection circuit 103 detects a difference between the I signal and Q signal. Based on the obtained error signal, the coefficients of the variable coefficient multipliers 101-I and 101-Q are updated to ones corresponding to the levels of input signals.

Figure 16:
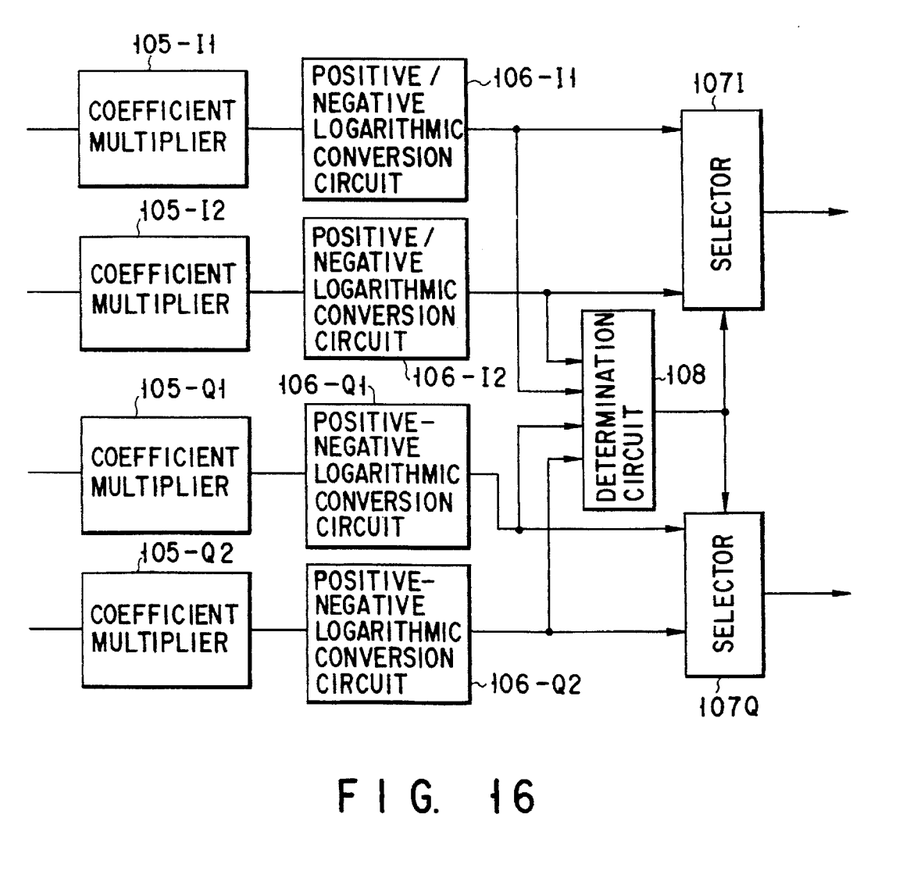
FIG. 16 is a block diagram showing a main part of a phase detector according to still another embodiment of the invention, wherein coefficients are switched according to input signal levels in an I signal system and a Q signal system, respectively.

According to an embodiment shown in FIG. 16, an I signal scheme comprises a plurality of coefficient multipliers 105-I1 and 105-I2, logarithmic converters 106-I1 and 106-I2 connected in series to the coefficient multipliers 105-I1 and 105-I2, and a selector 107I for selecting one of outputs from the logarithmic conversion circuits 106-I1 and 106-I2. A Q signal scheme comprises a plurality of coefficient multipliers 105-Q1 and 105-Q2, logarithmic conversion circuits 106-Q1 and 106-Q2 connected in series to the coefficient multipliers 105-Q1 and 105-Q2, and a selector 107Q for selecting one of outputs from the logarithmic conversion circuits 106-Q1 and 106-Q2. A determination circuit 108 determines the signal levels of the I signal scheme and Q signal scheme. Based on the determination results, the selectors 107I and 107Q selects outputs from the proper logarithmic conversion circuits.

According to this embodiment, the phase of an input signal having a very wide dynamic range can be detected without using a special logarithmic conversion circuit having a very wide range of operable input amplitude.

Figure 17:
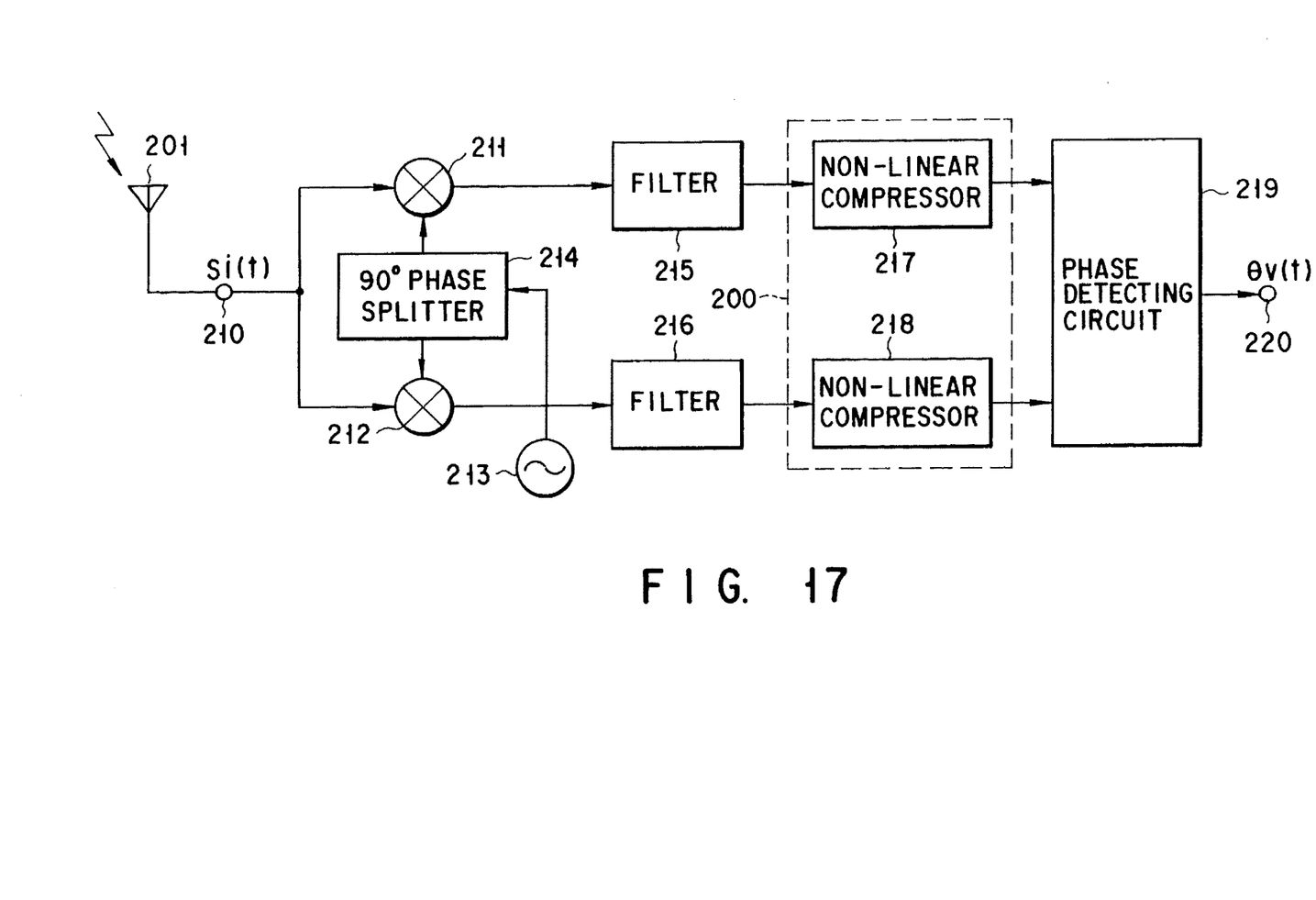
FIG. 17 is a block diagram showing an embodiment of a phase detector used for a receiver according to the present invention.

FIG. 17 shows a receiver of a radio apparatus according to the present invention. In this embodiment, the radio apparatus is of the direct conversion radio system. The direct conversion radio system will now be described.

In general, in the direct conversion receiving system, a received radio frequency signal is converted to a base-band frequency signal by a single frequency conversion operation by using a reference signal having a frequency substantially equal to the frequency of the received radio frequency signal. Thus, the converted signal is detected. The transmitter scheme and receiver scheme are reverse to each other in terms of the flow of signals. At first, the receiver scheme will be described in detail.

A radio frequency signal Si(t) received by an antenna unit 201 is divided into two-channel signals. In frequency converters 211 and 212, the two-channel signals are mixed with carrier waves from a reference signal source 213, which have frequencies substantially equal to the frequency of the radio frequency signal. The reference signal source 213 is connected to the first and second frequency converters 104a1 and 104a2 via a 90° phase shifter 105. The received radio frequency signal is converted to base frequency signals having a phase relationship of 90° C. by the first and second frequency converters 211 and 212. The base frequency signals are passed through low-pass filters 215 and 216, and converted to digital signals by non-linear compressors 217 and 218 of a non-linear compression unit 200. The digital signals are detected by a phase detection circuit for normal quadrature detection. Thereafter, speech/image digital data is reproduced by a communication path encoder (decoder), a speech encoder (decoder), etc.

In the direct conversion receiving system having the above structure, the received radio frequency signal is directly converted to the base band signal. Thus, this system is advantageous in that there is neither intermediate frequency nor image response in principle. Accordingly, there is no need to use an expensive filter with steep characteristics which is normally used for removing an image in a conventional heterodyne radio frequency stage. Such an expensive filter may be replaced by an inexpensive radio frequency filter of another system, which has a relatively wide band for attenuating interference waves alone.

Furthermore, unlike the conventional heterodyne system, there is no need to use an expensive channel selecting ceramic filter in an intermediate frequency stage, a frequency conversion reference crystal, etc. The channel selecting filters 215 and 216 for base frequencies can be integrated in an LSI by recent development of LSI technology. These filters can be made smaller and less expensive than intermediate frequency filters used in the heterodyne system.

For the above reasons, the radio apparatus using the direct conversion receiving system can be made smaller and less expensive than the conventional radio apparatus using the heterodyne receiving system.

As has been described above, according to the present invention, first and second signals are non-linearly compressed and the phases thereof are detected. Thus, the following advantages can be obtained:

(1) In the case of first and second signals with very wide dynamic ranges, which are obtained by directly converting input signals by quadrature modulation, as in the direct conversion method, the phases thereof can be detected quickly in accordance with the variation in input signals with a simple, small and inexpensive structure, compared to a conventional method matching with wide-dynamic range input signals by performing amplitude limitation after frequency reconversion.

(2) If logarithmic conversion is used for non-linear compression, the ratio between the first and second signals is calculated by finding a difference between two signals obtained by logarithmically converting the first and second signals intersecting at right angles. Thus, the phases of the first and second signals can be easily obtained from the calculated ratio.

(3) Since no feedback loop such as AGC is required, the follow-up characteristics for a variation in input signal level due to a variation in reception electric field intensity are very high.

(4) If an A/D converter is used in a process during or after phase detection, the dynamic range of the A/D converter may be narrow. Thus, the cost and size of the A/D converter may be reduced.

(5) Since the phase of a signal can be directly detected, the structure of a digital processing system for a data identification process after quadrature demodulation and other processes can be simplified.

(6) In the limiter system, amplitude information is removed. In the present invention, on the other hand, amplitude information can be taken out on an as needed basis. Therefore, this invention is effective even in the case where information of both phase and amplitude is required, as in the demodulation of QPSK waves.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A phase detector comprising:

quadrature modulation means for quadrature-modulating an input signal and obtaining two signals being in quadrature with each other;

non-linear compression means for non-linearly compressing said two signals; and phase detection means for detecting the phase of said input signal from the two signals compressed by said non-linear compression means.

2. A phase detector comprising:

quadrature demodulation means for quadrature-modulating an input signal with use of first and second reference signals differing in phase by 90° from each other, and outputting first and second signals being in quadrature with each other;

non-linear compression means for non-linearly compressing the first and second signals output from said quadrature demodulation means, thereby obtaining first and second compression signals; and phase detection means for detecting the phase of said input signal from a difference between the first and second compression signals obtained by said non-linear compression means.

3. The phase detector according to claim 2, wherein said non-linear compression means comprises first and second non-linear compression circuits for non-linearly compressing the first and second signals, each of the first and second non-linear compression circuits being constituted by logarithmic conversion means and absolute value detection means which are series-connected.

4. The phase detector according to claim 3, wherein each of the first and second non-linear compression circuits comprises a logarithmic conversion circuit for logarithmically compressing an associated one of the first and second signals and an absolute value detection circuit for calculating the absolute value of an associated one of first and second compression signals obtained by the logarithmic compression.

5. The phase detector according to claim 4, wherein said logarithmic conversion circuit comprises a series circuit of a resistor and a capacitor provided on an input side, an operational amplifier connected to an output side of the series circuit, and two diodes connected in parallel in opposite directions between an inverted input terminal and an output terminal of the operational amplifier, and both positive and negative components of an associated one of the first and second signals are subjected to logarithmic conversion, which is reverse conversion of exponential characteristics, by utilizing exponential characteristics between a diode forward current and a voltage drop and inserting said diodes in a negative feedback circuit.

6. The phase detector according to claim 5, wherein each of said diodes is constituted by a bipolar transistor having a collector and a base connected to each other, and the logarithmic compression is performed by utilizing collector current vs. base/emitter voltage characteristics or emitter current vs. base/emitter voltage characteristics of the bipolar transistor.

7. The phase detector according to claim 4, wherein each of said absolute value detection circuits comprises an inverting amplifier constituted by an operational amplifier and a resistor, a switch for selecting one of an input signal of said inverting amplifier, which is said compression signal, and an output signal of said inverting amplifier, and a gate circuit for controlling said switch in accordance with the polarity of the input signal of said inverting amplifier, and said switch selects the input signal of the inverting amplifier when the input signal of the inverting amplifier is positive and selects the output signal of the inverting amplifier when the input signal of the inverting amplifier is negative, thereby finding the absolute value of the compression signal from said logarithmic conversion circuit.

8. The phase detector according to claim 2, wherein said phase detection means comprises subtraction means for outputting a difference signal representing a difference between the two signals compressed by said non-linear compression means, and non-linear conversion means for converting the difference signal output from said subtraction means to a phase detection signal representing the phase of said input signal.

9. The phase detector according to claim 8, wherein said logarithmic conversion means comprises PN junction elements to which said first and second signals are input as currents, and means for deriving voltages occurring in said PN junction elements as outputs, and said non-linear conversion means comprises a pair of differential transistors having bases each receiving the difference signal output from the subtraction means or a signal obtained by multiplying the difference signal by a predetermined coefficient, a constant current source for supplying a constant current to a common emitter of the pair of differential transistors, and output means for deriving the phase detection signal from the collectors of the pair of differential transistors.

10. The phase detector according to claim 8, wherein said non-linear conversion means stores digital values of a plurality of said phase detection signals and is constituted by a conversion table having addresses designated to said difference signal.

11. The phase detector according to claim 2, wherein said non-linear compression means comprises a single non-linear compression circuit for non-linearly compressing said first and second signals alternately, and switch means, connected to said non-linear compression circuit, for selecting said first and second signals alternately on a time basis and inputting the selected one to said non-linear compression circuit.

12. The phase detector according to claim 2, further comprising an offset detection means for detecting an offset of the non-linear conversion means from an average value of one of the output signal from the phase detection means and the output signal from the non-linear conversion means, and offset removing means for removing the offset detected by said offset detection means from the output signal of the phase detection means.

13. A phase detector comprising:

quadrature demodulation means for quadrature-modulating an input signal with use of first and second reference signals having phases differing from each other by 90°, and outputting first and second signals being in quadrature with each other;

first and second non-linear compression means provided for said first and second signals, respectively, each of said first and second non-linear compression means including, a plurality of coefficient multipliers each having a different coefficient value multiplied by an associated one of said first and second signals, a plurality of logarithmic conversion circuits, connected in series to said coefficient multipliers, respectively, for logarithmically compressing output signals from said coefficient multipliers, a level determination circuit for determining a signal level of an associated one of the first and second signals, and a signal level of at least one of output signals of said plurality of logarithmic conversion circuits, and a selector, connected to an output side of said logarithmic conversion circuits, for selecting one of the outputs of said plurality of logarithmic conversion circuits according to a determination result of said level determination circuit, said first and second compression means outputting first and second compression signals; and phase detection means for detecting the phase of said input signal from a difference between the first and second compression signals of the first and second non-linear compression means.

14. A phase detector comprising:

quadrature demodulation means for quadrature-modulating an input signal with use of first and second reference signals having phases differing from each other by 90°, and outputting first and second signals being in quadrature with each other;

first non-linear compression means provided for said first signal, said first non-linear compression means including a first variable coefficient multiplier having a variable coefficient value multiplied by said first signal, and a first logarithmic conversion circuit, connected in series to said first coefficient multiplier, for logarithmically compressing an output signal from said first variable coefficient multiplier and outputting a first compression signal;

second non-linear compression means provided for said second signal, said second non-linear compression means including a second variable coefficient multiplier having a variable coefficient value multiplied by said second signal, and a second logarithmic conversion circuit, connected in series to said second coefficient multiplier, for logarithmically compressing an output signal from said second variable coefficient multiplier and outputting a second compression signal;

a level determination circuit for determining signal levels of output signals from said first and second logarithmic conversion circuits, and updating the coefficient values of the first and second coefficient multipliers according to a determination result; and phase detection means for detecting the phase of said input signal from a difference between the first and second compression signals of the first and second non-linear compression means.

15. An radio receiver apparatus comprising:

quadrature demodulation means for quadrature-demodulating a received signal by a local oscillation signal with a frequency substantially equal to a center frequency of the received signal to obtain two baseband signals being in quadrature with each other;

non-linear compression means for non-linearly compressing said two baseband signals; and phase detection means for detecting the phase of said received signal from the two baseband signals compressed by said non-linear compression means.

16. A radio receiver apparatus comprising:

quadrature demodulation means for quadrature-demodulating a received signal by a local oscillation signal with a frequency substantially equal to a center frequency of the received signal to obtain two baseband signals being in quadrature with each other;

non-linear compression means for non-linearly compressing the baseband signals output from said quadrature demodulation means, thereby obtaining first and second compression signals; and phase detection means for detecting the phase of said received signal from a difference between the first and second compression signals obtained by said non-linear compression means.

17. A radio receiver comprising:

quadrature demodulation means for quadrature-demodulating a received signal by a local oscillation signal with a frequency substantially equal to a center frequency of the received signal to obtain two baseband signals being in quadrature with each other;

first and second non-linear compression means provided for said baseband signals, respectively, each of said first and second non-linear compression means including, a plurality of coefficient multipliers each having a different coefficient value multiplied by an associated one of said baseband signals, a plurality of logarithmic conversion circuits, connected in series to said coefficient multipliers, respectively, for logarithmically compressing output signals from said coefficient multipliers, a level determination circuit for determining a signal level of an associated one of the baseband signals, and a signal level of at least one of output signals of said plurality of logarithmic conversion circuits, and a selector, connected to an output side of said logarithmic conversion circuits, for selecting one of the outputs of said plurality of logarithmic conversion circuits according to a determination result of said level determination circuit, said first and second compression means outputting first and second compression signals; and phase detection means for detecting the phase of said received signal from a difference between the first and second compression signals of the first and second non-linear compression means.

18. A radio receiver comprising:

quadrature demodulation means for quadrature-demodulating a received signal by a local oscillation signal with a frequency substantially equal to a center frequency of the received signal to obtain two baseband signals being in quadrature with each other;

first non-linear compression means provided for said first signal, said first non-linear compression means including a first variable coefficient multiplier having a variable coefficient value multiplied by said first signal, and a first logarithmic conversion circuit, connected in series to said first coefficient multiplier, for logarithmically compressing an output signal from said first variable coefficient multiplier and outputting a first compression signal;

second non-linear compression means provided for said second signal, said second non-linear compression means including a second variable coefficient multiplier having a variable coefficient value multiplied by said second signal, and a second logarithmic conversion circuit, connected in series to said second coefficient multiplier, for logarithmically compressing an output signal from said second variable coefficient multiplier and outputting a second compression signal;

a level determination circuit for determining signal levels of output signals from said first and second logarithmic conversion circuits, and updating the coefficient values of the first and second coefficient multipliers according to a determination result; and phase detection means for detecting the phase of said received signal from a difference between the first and second compression signals of the first and second non-linear compression means.

* * * * *